United States Patent
Huisman et al.

(10) Patent No.: US 8,559,175 B2
(45) Date of Patent: Oct. 15, 2013

(54) COOLING DEVICE FOR COOLING A SEMICONDUCTOR DIE

(75) Inventors: Bart-Hendrik Huisman, Eindhoven (NL); Nicolas Mignot, Genas (FR); Hendrik Jan Eggink, Eindhoven (NL); Clemens Johannes Maria Lasance, Nijenen (NL)

(73) Assignee: Koninlijke Philips N.V., Eindhoven (NL)

( * ) Notice: Subject to any disclaimer, the term of this patent is extended or adjusted under 35 U.S.C. 154(b) by 176 days.

(21) Appl. No.: 13/054,800

(22) PCT Filed: Jul. 16, 2009

(86) PCT No.: PCT/IB2009/053097
§ 371 (c)(1),
(2), (4) Date: Jan. 19, 2011

(87) PCT Pub. No.: WO2010/010495
PCT Pub. Date: Jan. 28, 2010

(65) Prior Publication Data
US 2011/0122579 A1    May 26, 2011

(30) Foreign Application Priority Data
Jul. 25, 2008    (EP) .................................. 08300243

(51) Int. Cl.
*H05K 7/20*    (2006.01)
(52) U.S. Cl.
USPC ...... 361/689; 361/679.47; 361/691; 361/692; 361/694; 361/709; 174/16.1; 174/548; 454/237

(58) Field of Classification Search
USPC ............... 361/676–678, 707, 709–710, 361/679.46–679.54, 688–704, 754
See application file for complete search history.

(56) References Cited

U.S. PATENT DOCUMENTS

| | | | |
|---|---|---|---|
| 6,428,189 B1 | 8/2002 | Hochstein | |
| 6,511,209 B1 | 1/2003 | Chiang | |
| 6,578,491 B2 * | 6/2003 | Babin | 102/293 |
| 6,608,283 B2 | 8/2003 | Liu et al. | |
| 6,676,279 B1 | 1/2004 | Hubbell et al. | |
| 6,698,499 B1 * | 3/2004 | Wagner et al. | 165/80.3 |

(Continued)

FOREIGN PATENT DOCUMENTS

| | | |
|---|---|---|
| EP | 1467416 A2 | 10/2004 |
| EP | 1519105 A2 | 3/2005 |

(Continued)

*Primary Examiner* — Courtney Smith
(74) *Attorney, Agent, or Firm* — David Zivan; Mark L. Beloborodov

(57) ABSTRACT

A semiconductor cooling device for transferring heat from a semiconductor die (111). The semiconductor cooling device includes a heat dissipator (112) that may be thermally coupled to a semiconductor module (111) to be cooled for dissipating heat from the semiconductor die (111); a housing (150) in or on which the semiconductor die (111) is mounted; a fluid flow passage (153) for providing a forced fluid flow within the housing (150); and a fluid path (155) arranged to guide the forced fluid flow in a first direction between the fluid flow passage (153) and the heat dissipator (112) and further arranged to guide the fluid flow along the heat dissipator (112) in a second direction different to the first direction. In a particular embodiment, the semiconductor cooling device is used to dissipate heat from an array of LEDs.

19 Claims, 16 Drawing Sheets

(56) References Cited

U.S. PATENT DOCUMENTS

| | | | |
|---|---|---|---|
| 7,114,837 B2 | 10/2006 | Yagi et al. | |
| 7,182,496 B2 | 2/2007 | Ruffin | |
| 7,345,320 B2 | 3/2008 | Dahm | |
| 7,602,618 B2* | 10/2009 | Akram et al. | 361/790 |
| 7,672,130 B2* | 3/2010 | Shen | 361/699 |
| 7,733,654 B2* | 6/2010 | Wang et al. | 361/710 |
| 7,974,099 B2* | 7/2011 | Grajcar | 361/720 |
| 8,081,464 B2* | 12/2011 | Mauroux et al. | 361/703 |
| 2004/0108104 A1* | 6/2004 | Luo | 165/181 |
| 2004/0127961 A1 | 7/2004 | Whitehurst | |
| 2004/0190305 A1 | 9/2004 | Arik et al. | |
| 2005/0002163 A1* | 1/2005 | Lopatinsky et al. | 361/697 |
| 2005/0007742 A1* | 1/2005 | Pleines et al. | 361/704 |
| 2005/0094397 A1 | 5/2005 | Yamada et al. | |
| 2005/0145366 A1* | 7/2005 | Erel | 165/80.3 |
| 2005/0269060 A1* | 12/2005 | Ku et al. | 165/80.3 |
| 2006/0039141 A1 | 2/2006 | Thrailkill et al. | |
| 2006/0049475 A1 | 3/2006 | Wang et al. | |
| 2006/0133090 A1 | 6/2006 | Noh et al. | |
| 2007/0057267 A1 | 3/2007 | Oman | |
| 2007/0076422 A1 | 4/2007 | Nicolai | |
| 2007/0165190 A1 | 7/2007 | Takagi | |
| 2007/0253202 A1* | 11/2007 | Wu et al. | 362/294 |
| 2007/0285920 A1 | 12/2007 | Seabrook | |
| 2008/0078524 A1 | 4/2008 | Wilcox et al. | |
| 2009/0262497 A1* | 10/2009 | Beauchamp et al. | 361/679.49 |
| 2010/0014251 A1* | 1/2010 | Refai-Ahmed | 361/701 |
| 2010/0328887 A1* | 12/2010 | Refai-Ahmed et al. | 361/697 |
| 2011/0076933 A1* | 3/2011 | Stenfors | 454/237 |

FOREIGN PATENT DOCUMENTS

| | | |
|---|---|---|
| GB | 1454836 | 11/1976 |
| WO | 2008037992 A1 | 4/2008 |
| WO | 2008051249 A1 | 5/2008 |

* cited by examiner

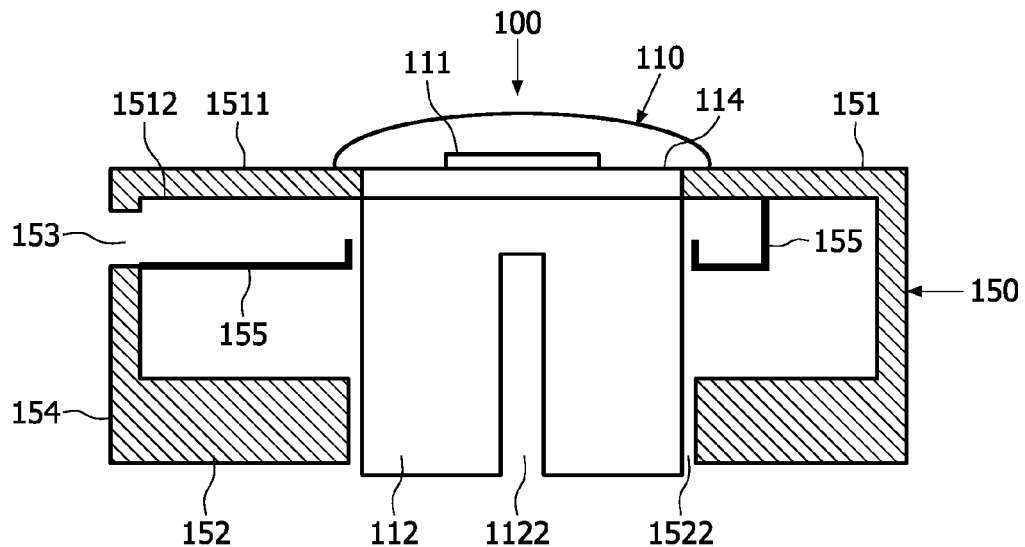
FIG. 1
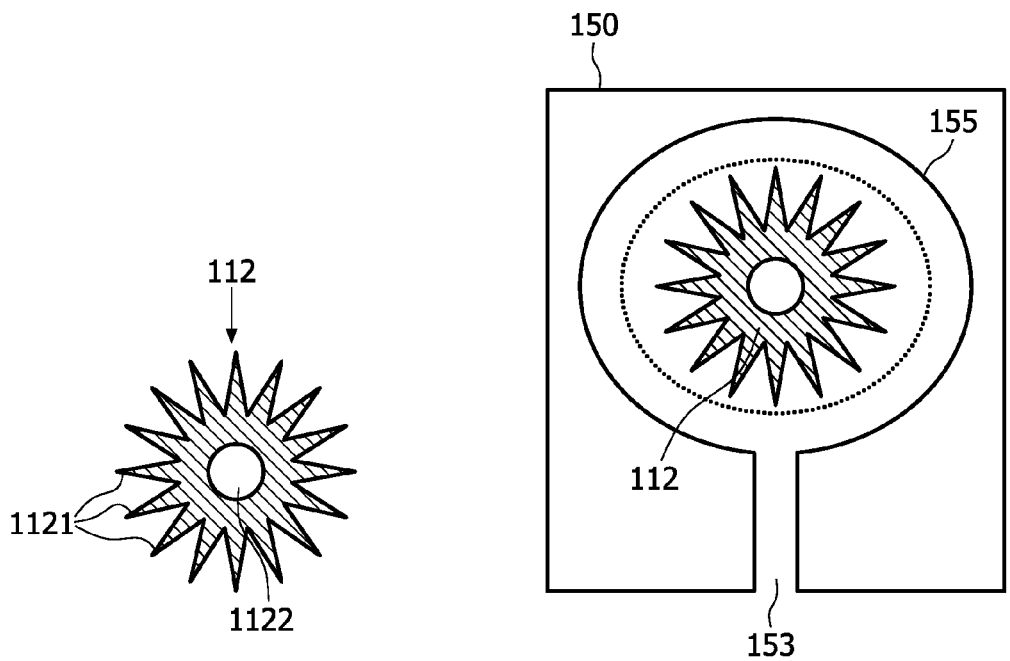
FIG. 2
FIG. 3

COOLING DEVICE FOR COOLING A SEMICONDUCTOR DIE

FIELD OF THE INVENTION

The present invention relates to a cooling device for cooling a semiconductor die. Particularly, but not exclusively, the invention relates to a semiconductor cooling device for cooling LEDs of an optical device.

BACKGROUND OF THE INVENTION

In semiconductor devices such as Integrated Circuits (IC) or Light Emitting Diodes (LED), performance and device lifetime are influenced by the temperature of the PN junction of the semiconductor die or chip. Management of the temperature of semiconductor devices is therefore of importance in maintaining reliable performance and long term operation. Such thermal management of semiconductor devices is of particular importance in applications with long life requirements, and in applications comprising a number of semiconductor devices.

For instance, in a lighting application, an optical device, for example, a luminaire may comprise an array of light sources such as LEDs. The number of LEDs as well as their proximity to one another leads to a more significant generation of thermal energy. Consequently, managing cooling of the devices becomes more critical for long term, reliable operation.

Various solutions for cooling semiconductor devices have been proposed. For example, WO 2008/037992 describes a thermally managed lamp assembly in which a number of high power LEDs are mounted in a housing. A drawback of the system described in WO 2008/037992 is that heat transfer efficiency is not optimised since the air flow passes from one LED heat sink assembly to another. Furthermore, dust can be drawn into the housing during operation of the device. The presence of this dust can be detrimental to the performance of the LEDs. In one particular construction, each LED is provided with a fan to produce a current of air to cool the respective LED. Such a configuration suffers the drawback that noise generation of the fans creates a generally noisy environment and can be detrimental to the performance of the semiconductor device. Moreover, in view of the number of fans employed, the overall device can be costly and cumbersome.

SUMMARY OF THE INVENTION

Accordingly, it would be advantageous to provide a semiconductor cooling device having an improved cooling efficiency. It would also be desirable to provide a semiconductor cooling device which could operate with reduced dust intake, reduced noise, and which is compact in size at a reduced cost.

To better address one or more of the foregoing concerns, in accordance with a first aspect of the invention there is provided a cooling device for cooling a semiconductor die, the device comprising: a heat dissipator for thermally coupling to a semiconductor die, the dissipator being arranged to dissipate heat from the semiconductor module; a housing to which the heat dissipator is mounted; a first fluid flow passage for providing a forced fluid flow within the housing; and a fluid flow path arranged for directing fluid along a first direction between the first fluid flow passage and the heat dissipator, and further arranged for forcing fluid along the heat dissipator in a second direction, different to the first direction.

In an embodiment of the invention the housing comprises: a first plate for supporting the semiconductor die; and a second plate opposing the first plate, the second plate being provided with an aperture arranged to receive the heat dissipator therethough, wherein at least part of the fluid flow path for directing the fluid flow along the heat dissipator in the second direction is defined by the walls of the aperture and the walls of the dissipator.

In a particular embodiment, the first fluid flow passage is disposed on a lateral wall of the housing perpendicular to the first plate and the second plate.

In a further embodiment, the aperture for receiving the heat dissipator forms a second fluid flow passage for exiting fluid flow from the housing. Thus, in this embodiment, fluid is forced to leave the housing by passing along the heat dissipator. The second fluid flow passage may also be for receiving fluid flow into the housing.

In an embodiment the heat dissipator extends from the semiconductor die through the aperture such that the heat dissipator is in contact with fluid medium outside the housing The fluid flow path may be defined by a fluid channel assembly. The channel assembly may be defined, for example, by the front and back plate.

In an embodiment the first fluid flow passage is in fluid communication with a pulsed airjet generator. In a particular embodiment, a hollow core of the dissipator is in fluid communication with the pulsed airjet generator.

In one embodiment the heat dissipator may be couplable to the housing by a snap-fitting.

In a particular embodiment the semiconductor cooling device comprises at least one heat dissipator thermally couplable to a plurality of semiconductor dies, and at least one aperture defined in the housing for receiving at least one heat dissipator and the fluid flow path is arranged to direct fluid from the first fluid flow passage onto the or each dissipator. In an embodiment the device may comprise a plurality of heat dissipators and each heat dissipator may be thermally coupled to a corresponding semiconductor die, and the device may further comprise a plurality of apertures wherein each aperture may be arranged to receive a corresponding heat dissipator therethrough. The plurality of heat dissipators can be arranged, for example, in a matrix.

According to a further aspect of the invention, there is provided an electronic device comprising a semiconductor module and a cooling device as hereinbefore described for cooling the semiconductor module.

An even further aspect of the invention provides an optical device comprising at least one semiconductor die having light emissive properties. The semiconductor die, may for example be an LED.

According to further aspect of the invention, there is provided a method of cooling a semiconductor die, the method comprising: thermally coupling a heat dissipator to the semiconductor module to dissipate heat from the semiconductor module; mounting the semiconductor module to a housing; providing a forced fluid flow within the housing; guiding the forced fluid flow along a fluid path in a first direction between a first aperture defined on the housing and the heat dissipator, and directing the forced fluid in a second direction along the heat dissipator, the second direction being different to the first direction. Providing a forced fluid flow within the housing, may, for example, include generating a forced fluid flow and receiving the forced fluid flow into the housing.

In a particular embodiment the fluid flow is forced along the heat dissipator in the second direction to exit the housing via a second aperture in which the heat dissipator is received.

In a further embodiment the forced air flow is provided in the form of pulsed fluid jets. Fluid may be ingested from around the heat dissipator and expelled onto the heat dissipator. Fluid may be ingested around a hollow core of the heat dissipator and fluid may be expelled through the hollow core of the heat dissipator.

BRIEF DESCRIPTION OF THE DRAWINGS

Embodiments of the invention will now be described, by way of example only, and with reference to the following drawings in which:

FIG. 1 is a schematic view of a semiconductor cooling device according to a first embodiment of the invention;

FIG. 2 is a cross-sectional view of a heat sink of the semiconductor cooling device of FIG. 1;

FIG. 3 is a schematic view of a channel assembly of the semiconductor cooling device of FIG. 1;

DETAILED DESCRIPTION

Figure 4A:
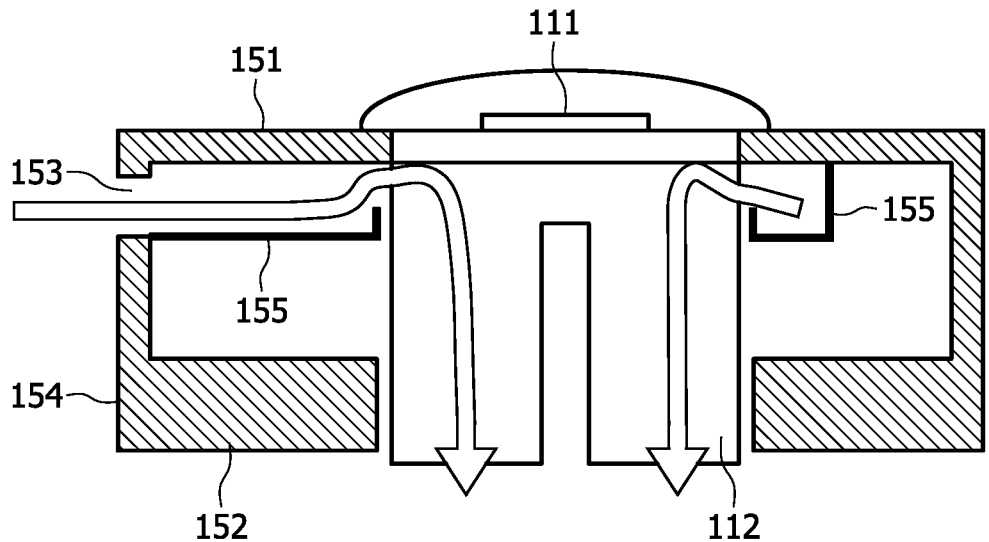
FIG. 4A is a schematic view of a semiconductor cooling device according to the first embodiment of the invention showing the direction of fluid flow.

A semiconductor cooling device according to a first embodiment of the invention will be described with reference to FIGS. 1 to 4B.

With reference to FIG. 1, the semiconductor cooling device 100 according to the first embodiment of the invention comprises an LED-dissipator assembly 110 mounted in a housing assembly 150. The LED-dissipator assembly 110 comprises a LED element 111, to be cooled, mounted on a heat sink 112 for dissipating heat from the LED element 111. As depicted in FIG. 2 the heat sink 112 is provided with cooling fins, generally indicated by reference 1121, extending radially therefrom to increase the surface area of the heat sink 112 for heat dissipation, and a hollow core area 1122. The heat sink 112 in this embodiment has a diameter of approximately 1 cm. Heat sink 112 is thermally coupled to the LED element 111 by means of a heat slug 114, and is made out of metal, or any other suitable thermally conductive material such as plastics or ceramics, to provide conduction of heat away from the LED element 111.

Housing assembly 150, in which the LED-dissipator assembly 110 is mounted, comprises a front plate 151, a back plate 152 and an airflow inlet 153 provided on a lateral wall 154 thereof for receiving a a forced fluid flow in the form of a stream of forced air into the housing 150 and enabling a cooling air flow to be created between the front plate 151 and the back plate 152. The front plate 151 has an external surface 1511 and an inner surface 1512. The LED element 111 is mounted to face outwardly from the external surface 1511. The heat slug 114 forms part of the front plate 151 and thermally couples the LED element 11 to the heat sink 112 through the front plate 151. The LED element 111 is provided with electrical power through electrical connections (not shown) in front plate 151. Front plate 151 may be formed by a PCB or any suitable substrate supporting electrical connections to the LED element 111. In this embodiment the heat dissipator may be mounted on the front plate by soldering or by any suitable fixing means.

Inner surface 1512 of front plate 151 is provided with a channel assembly 155 for guiding the airflow from side 154 of the housing 150 through the air flow inlet 153 transversally between the front plate 151 and the back plate 152 onto the heat sink 112. The channel assembly 155 is coupled by any suitable means of fixation such as welding to front plate 151. The seal between the channel assembly 155 and the front plate 151 is airtight to minimise loss of air flowing to the heat sink 112. FIG. 3 is a planar view of channel assembly 155. The channel assembly 155 is configured to guide air flow from air inlet 153 to the peripheral region around the heat sink 112 so that air is directed onto the heat sink 112 at an upper region of the heat sink 112 close to the LED element 111. The length and cross section of the channel assembly can be selected to adjust the flow. In this particular embodiment the channel assembly 155 is made of plastics and manufactured by injection moulding. This helps to reduce the cost of manufacture of the device.

Back plate 152 is provided with an aperture 1522 which is arranged to receive the heat sink 112 in such a manner that the heat sink 112 extends from the LED element 111 therethrough such that the heat sink 112 is in contact with air outside the housing 150. Thus heat may be transferred from the heat sink 112 to the air outside the housing. The walls of the aperture 1522 and the walls of the heat sink 112 define a channel for the airflow leaving the housing along the heat dissipator 112.

Airflow is generated by an airflow generator (not shown) in fluid communication with air inlet 153. An airstream from the airflow generator enters the housing 150 through air flow inlet 153 and is directed by channel assembly 155 defining a fluid path through the housing 150 between front plate 151 and back plate 152 onto the heat sink 112 of the LED element 111. The airflow generator in this embodiment of the invention may be a fan or pump or any like airflow generating device known in the art that can generate a forced steady airflow. It will also be appreciated that a steady flow of air through the channel assembly 150 to the heat sink 112 may be generated by any suitable means of creating a pressure differential between an airflow inlet and an airflow outlet that forces air from the inlet along the heat sink to the outlet.

Figure 4B:
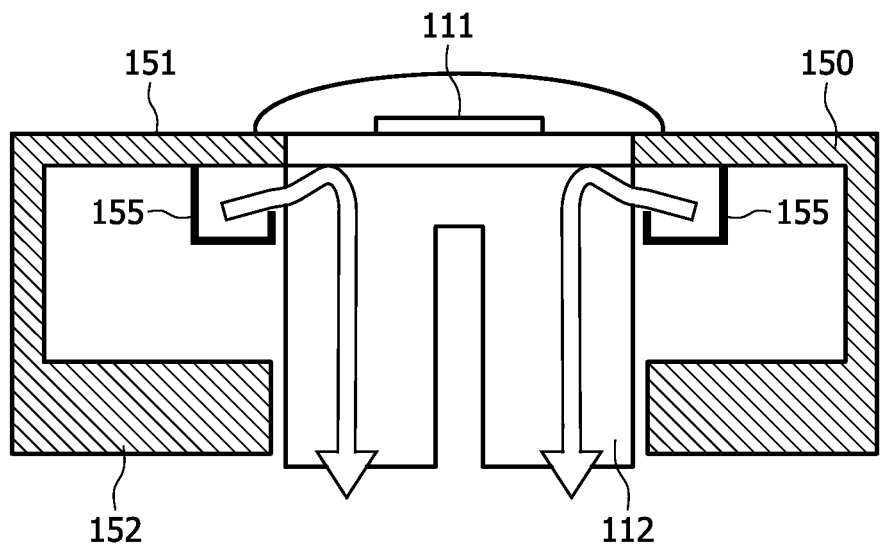
FIG. 4B is a perpendicular view to the schematic view of FIG. 4A showing the direction of fluid flow.

With reference to FIGS. 4A and 4B an air flow reaching the peripheral region of heat sink 112 from air flow inlet 153 via channel assembly 155 is guided to the upper region of the heat sink 112 proximal to the LED element 111, to flow along the length or major axis of the heat sink 112 between fins 1121, in an axial direction, from the front plate 151 towards the back plate 152, and exits the housing 150 via the aperture 1522 which forms an outlet for the air flow.

Heat is transferred from the heat sink 112 to the air flow thereby cooling the LED element 111. Since in this embodiment the cooling air flow is forced along the length of the heat sink 112 to reach aperture outlet 1522 in order to exit the housing 150, contact between the air flow and the heat sink 112 is increased and an improvement in cooling efficiency can be achieved. Furthermore since no internal fans are required to provide the cooling airflow, the overall device can be less cumbersome and less noisy. Since air flow is received via an inlet on a lateral wall of the housing, the air flow generator may be placed at the side of the device resulting in an overall flatter, more compact device. In addition, compared to the device of the prior art the intake of dust to the device can be reduced.

Figure 5:
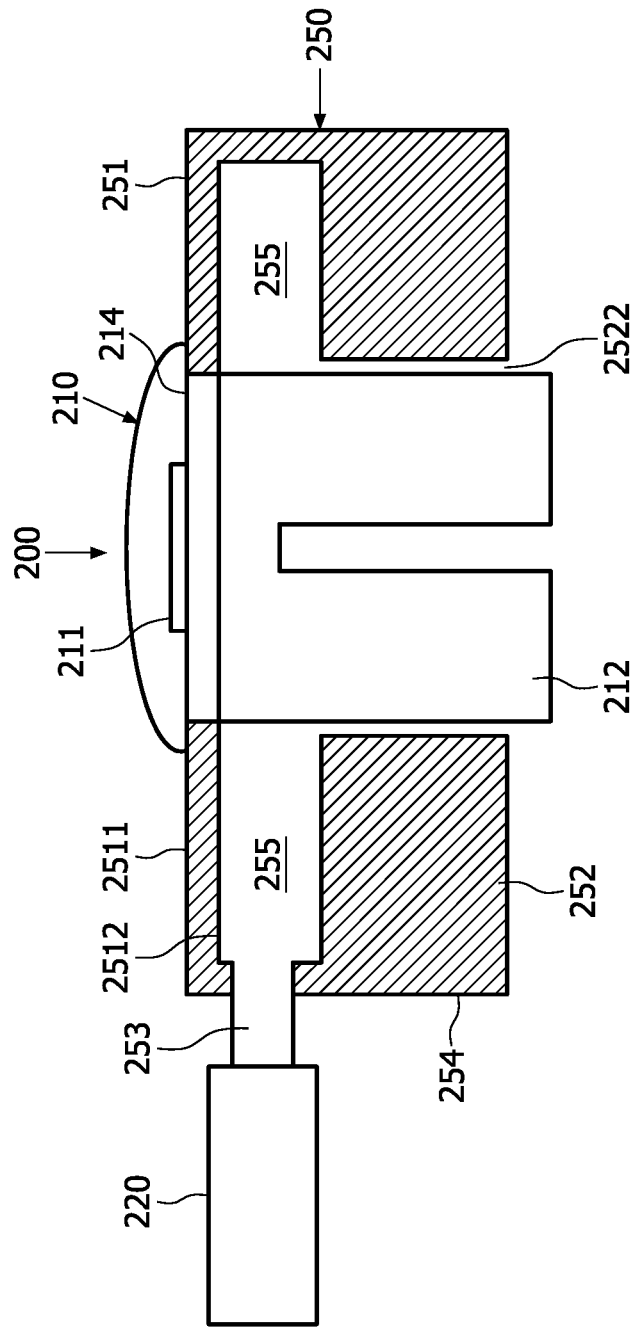
FIG. 5 is a schematic view of a semiconductor cooling device according to a second embodiment of the invention.
Figure 6A:
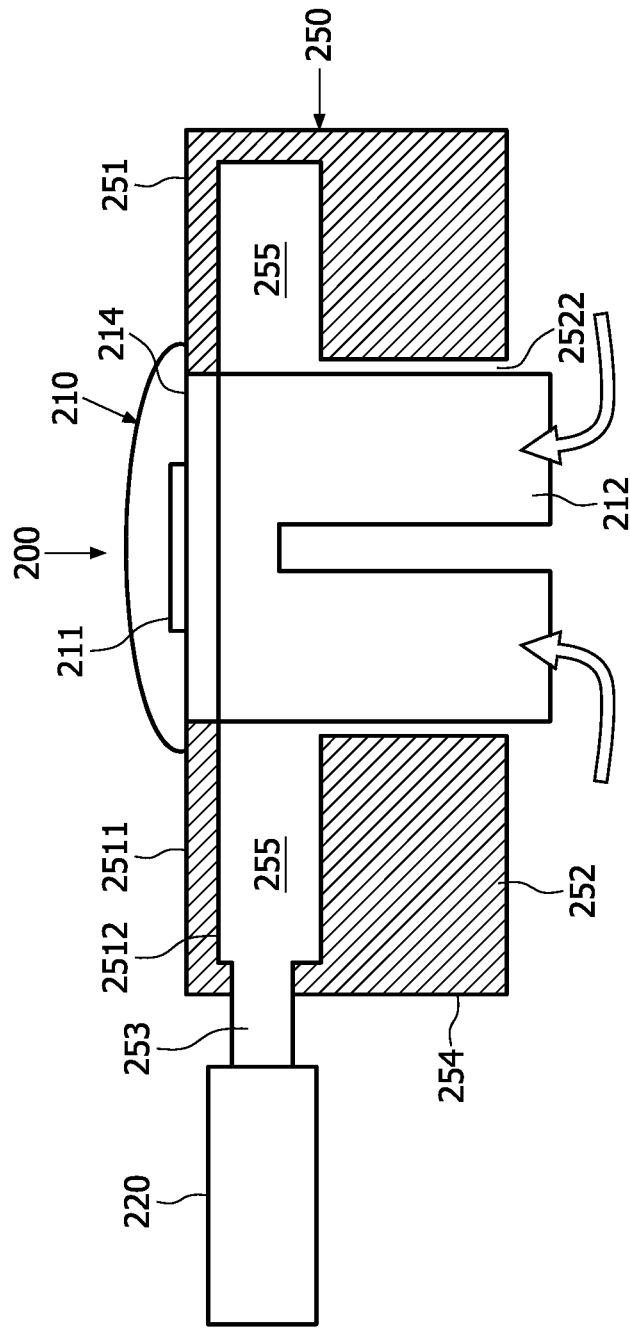
FIG. 6A is a schematic view of a semiconductor cooling device according to the second embodiment of the invention showing the direction of fluid flow during a suction stroke.
Figure 6B:
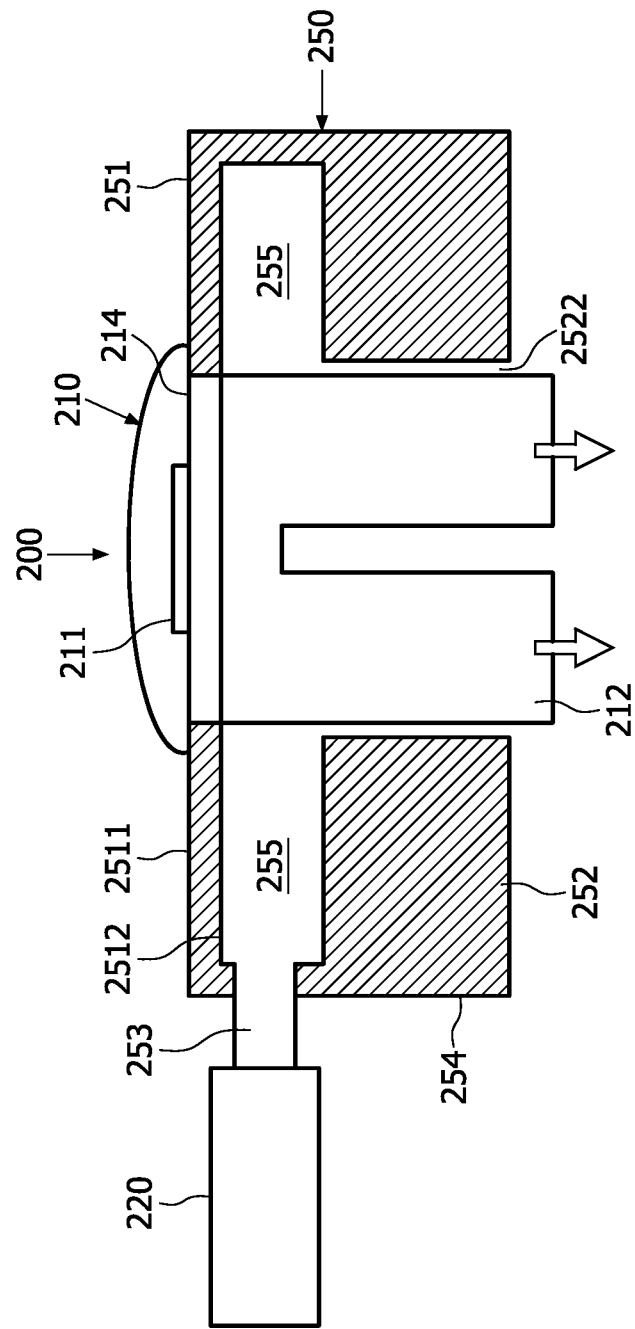
FIG. 6B is a schematic view of a semiconductor cooling device according to the second embodiment of the invention showing the direction of fluid flow during a blowing stroke.

In alternative embodiments of the invention the air flow may be supplied to the heat sink in the form of pulses or jets of air. For instance, with reference to FIG. 5, in a second embodiment of the invention, the semiconductor cooling device 200 is similar to the semiconductor cooling assembly of the first embodiment but the airflow generator of the first embodiment is replaced by a synthetic jet actuator module 220, and the fluid path from the airflow inlet 253 on the lateral wall 254 of the housing 250 to the heat sink 212 is defined by the front plate 251 and the back plate 252. A synthetic jet actuator module generates an air flow in the form of turbulent pulsated air jets which can be directed to the heat sink 212. In operation, during a suction stroke, as illustrated in FIG. 6A, cool air is ingested along a fluid path by the synthetic jet actuator module 220 from around the heat sink 212 through the space defined by the fins 2121 and the aperture 2522 thereby moving heat away from the heat sink 212. As depicted in FIG. 6B, during the blowing stroke of operation air is expelled in a jet-like outward direction along a fluid path through the heat sink 212 providing an air flow along the heat sink 212 through the space defined by the fins 2121 and the aperture 2522 thereby transferring again heat from the heat sink 212 and thus from the LED element 211.

The operating parameters of the synthetic jet actuator made be adjusted to control the air flow.

The turbulence of the airflow generated by the synthetic jet actuator module 220 leads to a more efficient heat transfer from the heat sink 212 to the air flow. Being more thermally efficient, the amount of air flow needed to cool the same heat load can be reduced. Moreover, the pulsating nature of the airflow increases mixing between the boundary layer and the mean flow.

In the second embodiment, use of the synthetic jet actuator module 220 results in a higher effective heat transfer. Furthermore, such modules can provide a more silent operation than a fan or pump, reduced power consumption, a more compact size and a longer lifetime.

Figure 7:
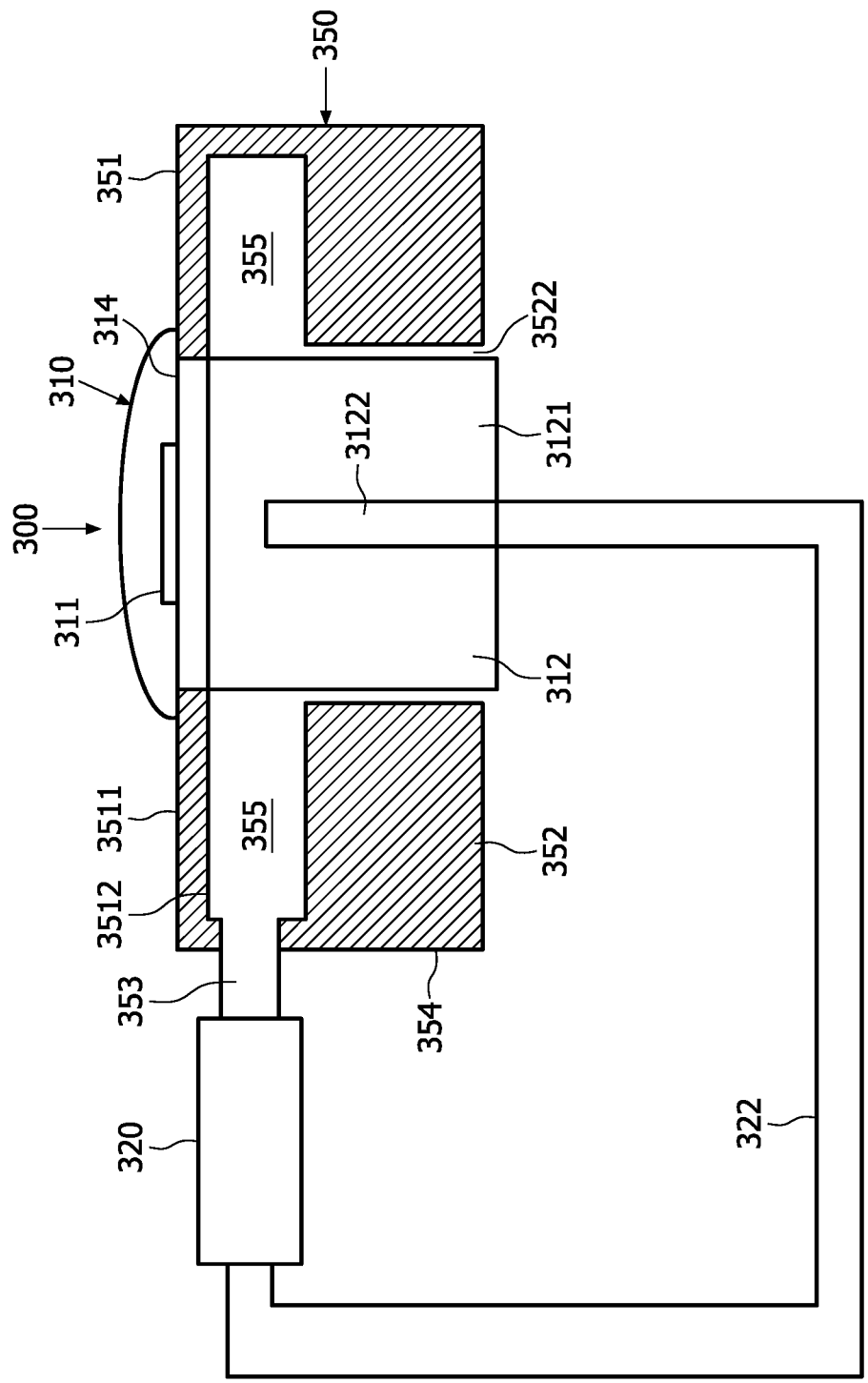
FIG. 7 is a schematic view of a semiconductor cooling device according to a third embodiment of the invention.
Figure 8A:
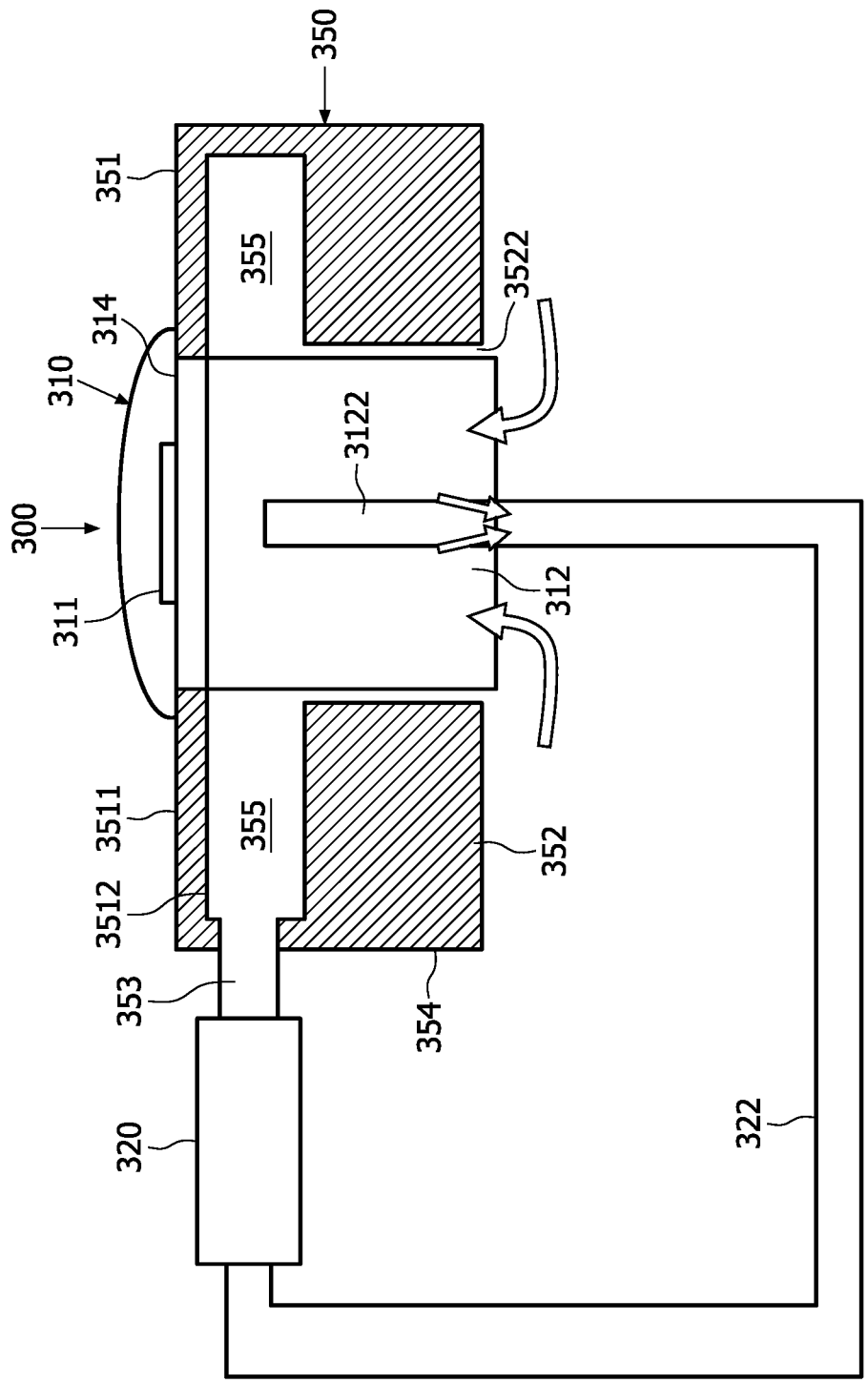
FIG. 8A is a schematic view of a semiconductor cooling device according to the third embodiment of the invention showing the direction of fluid flow during a first phase of operation.
Figure 8B:
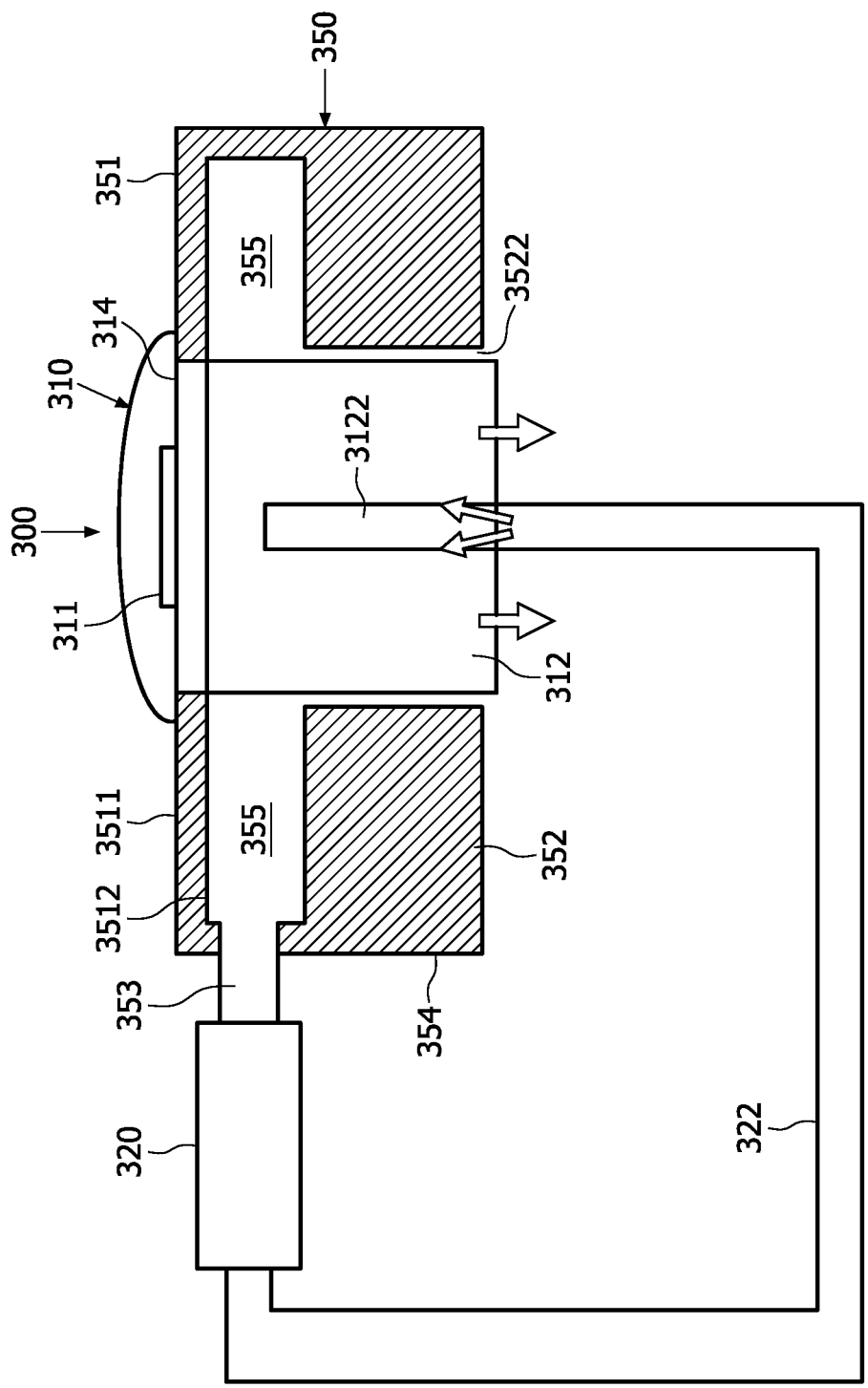
FIG. 8B is a schematic view of a semiconductor cooling device according to the third embodiment of the invention showing the direction of fluid flow during a second phase of operation.
Figure 9:
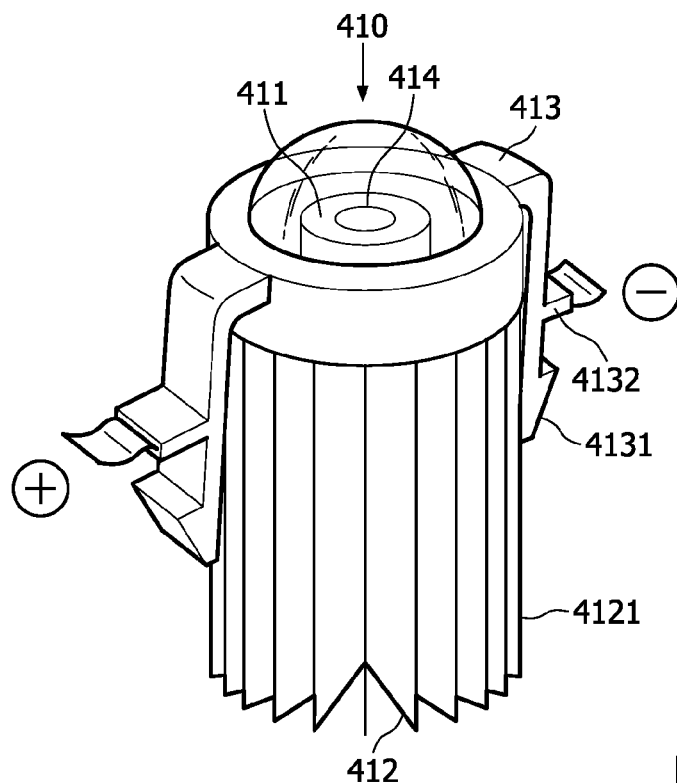
FIG. 9 is a perspective view of a LED-dissipator assembly according to a fourth embodiment of the invention.
Figure 10:
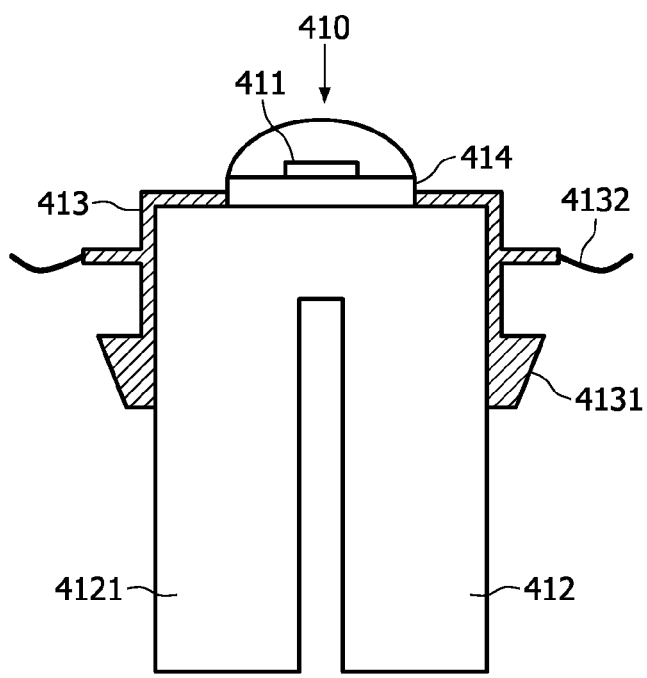
FIG. 10 is a schematic view of a LED-dissipator assembly according to the fourth embodiment of the invention.

A third embodiment of the invention will now be described with reference to FIGS. 7 to 8B. The third embodiment is similar to the second embodiment. In this embodiment a synthetic jet generator module 320 similar to the synthetic jet generator module 220 of the second embodiment is used and the fluid channel assembly is defined by the back plate 352 and the front plate 351. In the third embodiment, however, the synthetic generator 320 is connected to the fluid flow inlet 353 on a lateral wall 354 of the housing 350 through its front side and by its backside to the hollow core 3122 of heat sink 312 via fluid channel 322. In this configuration both sides of the synthetic jet generator module 320 can be exploited in such a manner that, in addition to the fins 3121 of the heat sink 312, the core 3122 (which may be also provided with fins) can also be cooled by ingestion and expulsion of air in a similar manner to the previous embodiment. Ingestion of air from the heat sink core 3122 may take place simultaneously with expulsion of air to the heat sink fins 3121 and vice versa. An additional advantage is that, since the jets are out of phase the driving frequency noise can be cancelled. In this way the efficiency of heat transfer can be further increased and the noise further reduced. The design is of the device of this embodiment is such that ingestion of heated expelled air at the same time as the ingestion of sucked in cooling air is minimised or prevented.

A semiconductor cooling device 400 according to a fourth embodiment of the invention will now be described with reference to FIGS. 9 to 11B. In this embodiment of the invention, the LED-dissipator assembly 410 comprises a heat dissipator 412 thermally coupled to an LED element 411 and is further provided with a plastic support member 413 having lateral extensions 4131 to provide a snap fit to the housing assembly 450, and electrical contact elements 4132 for transferring electrical power to the LED element 411 from a suitable power source (not shown) via the front plate 451.

Figure 11A:
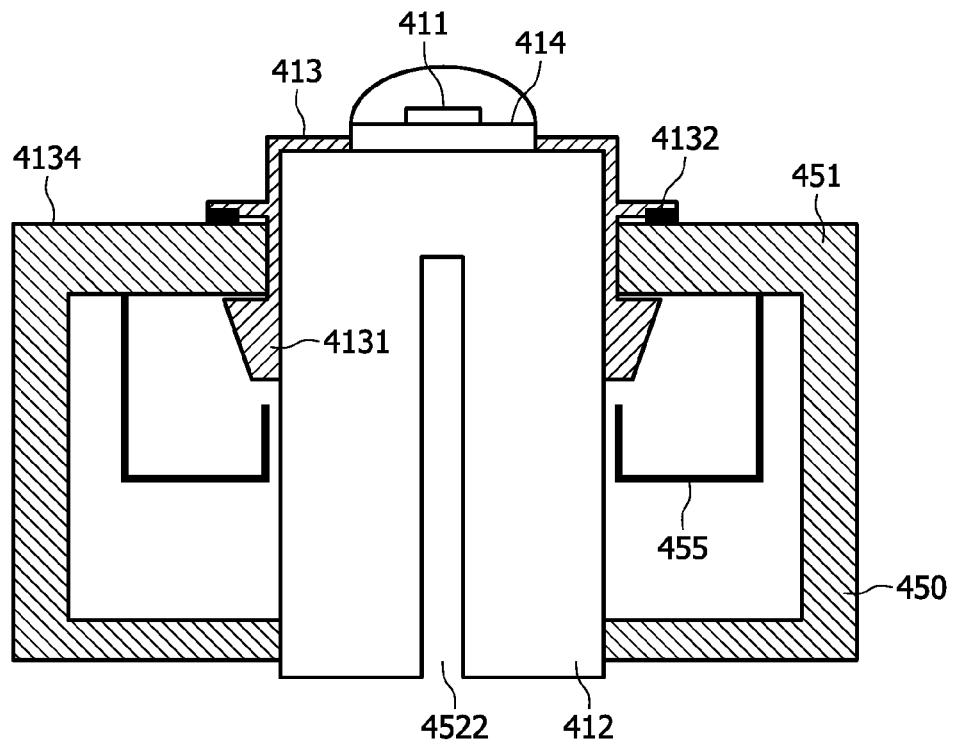
FIG. 11A is a schematic view of a semiconductor cooling device according to the fourth embodiment of the invention.

As depicted in FIG. 11A, the LED-dissipator assembly 410 of the second embodiment is removably attached by snap fit to the front plate 451 of housing assembly 450. Lateral extensions 4131 provide a formation to co-operate with front plate 451 to couple the LED-dissipator assembly to front plate 451. Fixation mechanism 4134 fixes channel assembly 455 to front plate 451. Channel assembly 455 has an identical layout to channel assembly 155 of the first embodiment. The dissipator assembly 410 is mounted such that the heat sink 412 extends from the LED element 411 through the aperture 4522 of the lower plate 452 so that the heat sink 412 is in contact with air exterior to the housing 450.

Figure 11B:
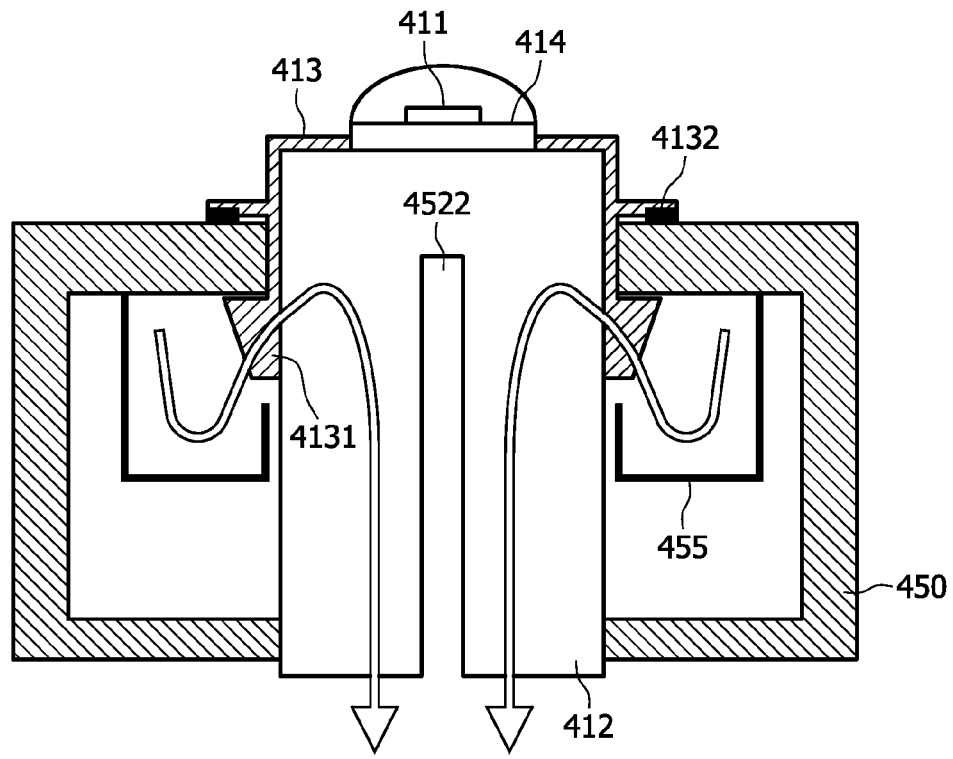
FIG. 11B is a schematic view of the semiconductor cooling device of FIG. 11A showing fluid flow.

Airflow is generated by an airflow generator (not shown) in fluid communication with air inlet similar to air inlet 153 of the first embodiment. The airflow generator may be an airflow generator similar to that of the first embodiment in which a steady air flow to the heat sink 412 is generated. Alternatively, airflow may be provided in the form of air pulses by a pulsed air generator similar to the synthetic jet generator of the second and third embodiments. Airflow is directed by channel assembly 455 through the housing 450 between front plate 451 and back plate 452 in a transverse direction, onto the upper region of heat sink 412 of the LED element 411 as illustrated in FIG. 11B. The flow of air is then forced in a longitudinal direction along the length of the heat sink 412 between fins 4121, in an axial direction from the top plate 451 towards the bottom plate 452, and exits the housing 450 via the aperture 4522 which forms an air flow outlet.

Figure 12A:
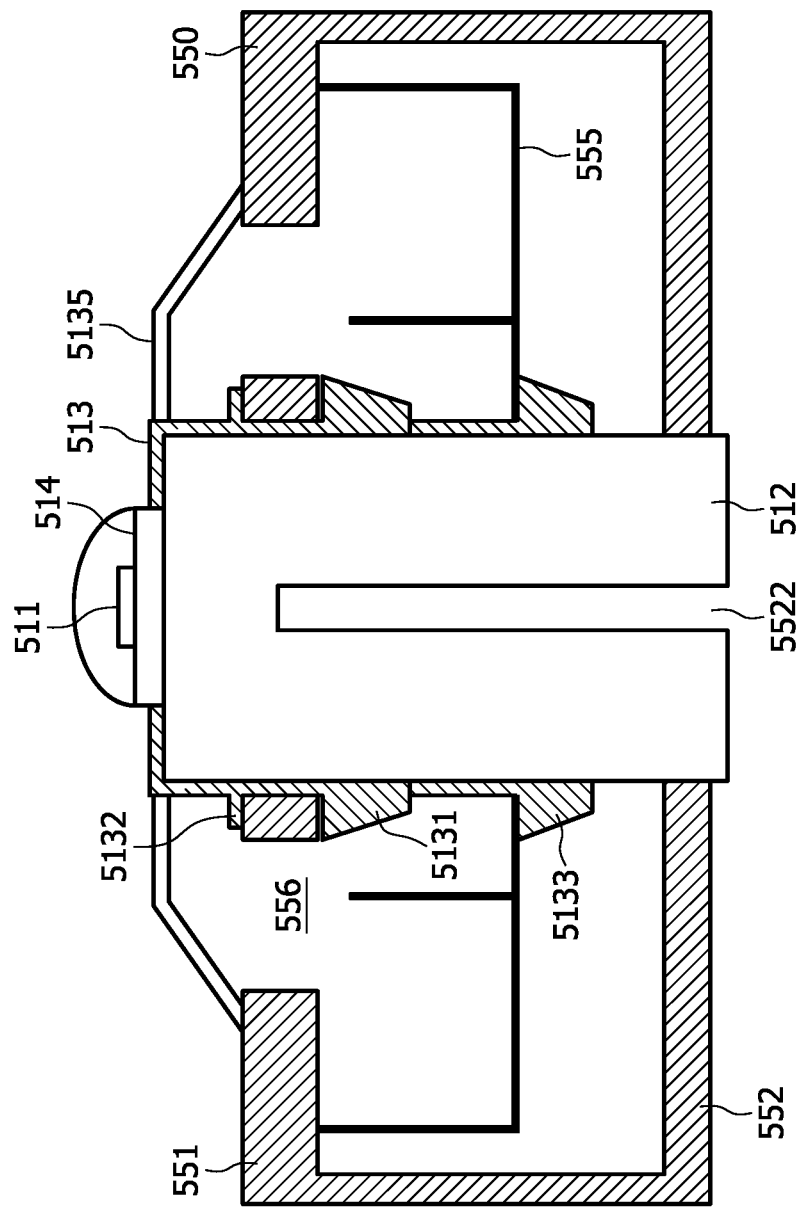
FIG. 12A is a schematic view of a semiconductor cooling device according to a fifth embodiment of the invention.
Figure 12B:
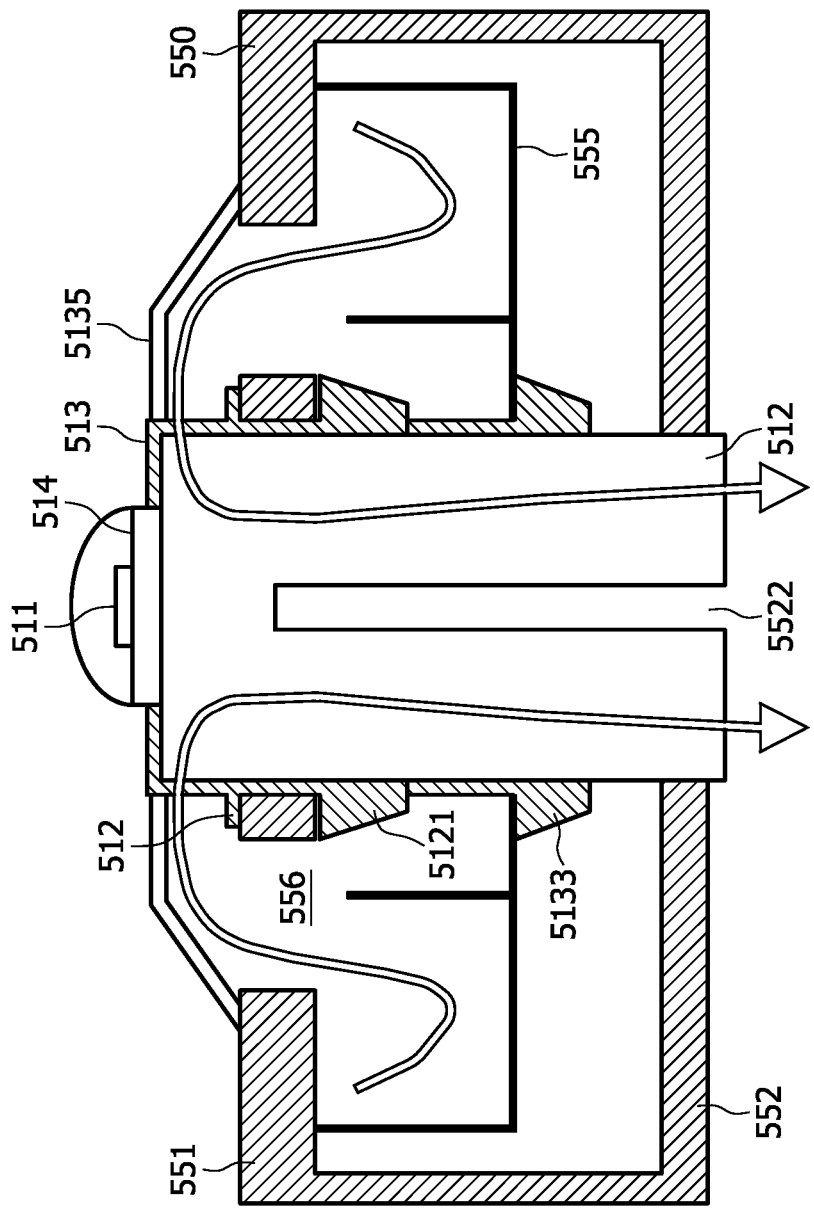
FIG. 12B is a schematic view of the semiconductor cooling device of FIG. 12A showing fluid flow.
Figure 13A:
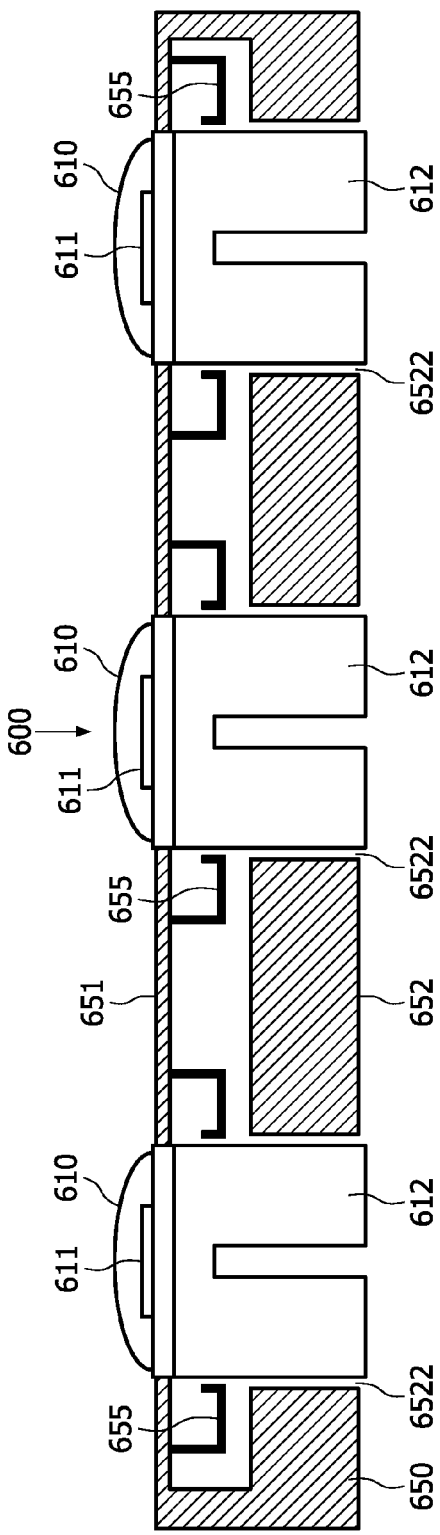
FIG. 13A is a schematic view of a semiconductor cooling device according to a sixth embodiment of the invention.
Figure 13B:
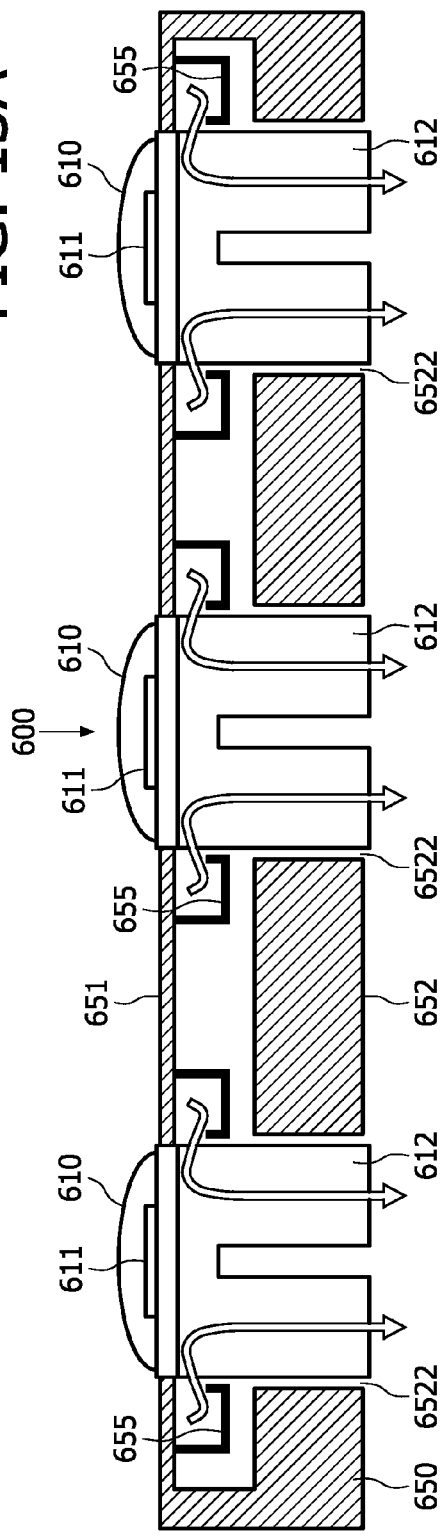
FIG. 13B is a schematic view of the semiconductor cooling device of FIG. 13A showing fluid flow.

Heat is transferred from the heat sink 412 to the air flow thereby cooling the LED element 411. Since in this embodiment the cooling air is forced along the heat dissipator in an axial direction to reach an outlet of the housing 450 an improvement in cooling efficiency can be achieved A semiconductor cooling device 500 according to a fifth embodiment of the invention will be described with reference to FIGS. 12A and 12B.

The semiconductor cooling device 500 is similar to the semiconductor cooling device 400 of the fourth embodiment. In addition to the snap fit formations 5131 for fitting the LED-dissipator assembly 510 to front plate 551 the support member 513 is further provided with lower lateral extensions 5133 to couple LED-dissipator assembly 510 to channel assembly 555. Such an arrangement helps to further fix channel assembly 555 to front plate 551.

An aperture 556 is defined in the front plate 551 to provide an airflow path from the channel assembly 555 to the upper region of the heat sink 512. The airflow path is sealed by an additional lateral extension 5135 of support member 513. In this way the first plate 551 defines an aperture 556 forming part of the fluid flow path for forcing fluid onto an end region of the heat dissipator 512 proximal to the LED element 411 and the lateral extension constitutes a sealing member for sealing the fluid flow path.

Airflow is generated by an airflow generator (not shown) in fluid communication with an air inlet similar to the air inlet 153 of the first embodiment. The airflow generator may be an airflow generator similar to that of the first embodiment in which a steady air flow to the heat sink 512 is generated. Alternatively, airflow may be provided in the form of air pulses by a pulsed air generator similar to the synthetic jet generator of the second and third embodiments. Airflow is directed through the channel assembly 555 between front plate 551 and back plate 552, and through aperture 556 onto the upper region of heat sink 512 of the LED element 511. The airstream is then forced along the length of the heat sink 512 between fins 5121, in an axial direction from the top plate 551 towards the bottom plate 552, and exits the housing 550 via the aperture 5522.

A sixth embodiment of the invention will now be described with reference to FIGS. 13A to 14B. In the sixth embodiment a plurality of LED-dissipator assemblies 610 are mounted in an array in a housing assembly 650. Each LED-dissipator assembly 610 is similar to the LED-dissipator assembly 110 of the first embodiment, and comprises an LED element 611 thermally coupled to a respective heat sink 612 by means of a heat slug 614.

Housing assembly 650 comprises a front plate 651, a back plate 652 and an airflow inlet 653 provided on a lateral wall 654 thereof for receiving a stream of forced air into the housing 650 and enabling a cooling airstream to be created between the front plate 651 and the back plate 652. A printed circuit board (PCB) or any suitable like substrate forms the front plate 651 which has an external surface 6511 and an inner surface 6512. Each LED element 611 is mounted to face outwardly from the external surface 6511 and is provided with electrical power through electrical connections in the front plate 651.

Inner surface 6512 of front plate 651 is provided with a channel assembly 655 for guiding the airstream from the common heat sink inlet 653 onto each heat sink 612. The seal between the channel assembly 655 and the front plate 651 is airtight to minimise loss of cooling air to the heat sinks 612.

Figure 14A:
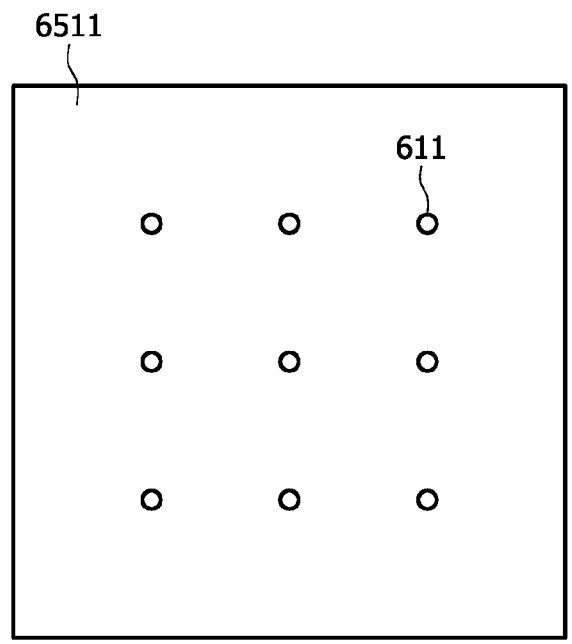
FIG. 14A is a planar view of the outer side of the front plate of the semiconductor device of FIG. 13A.
Figure 14B:
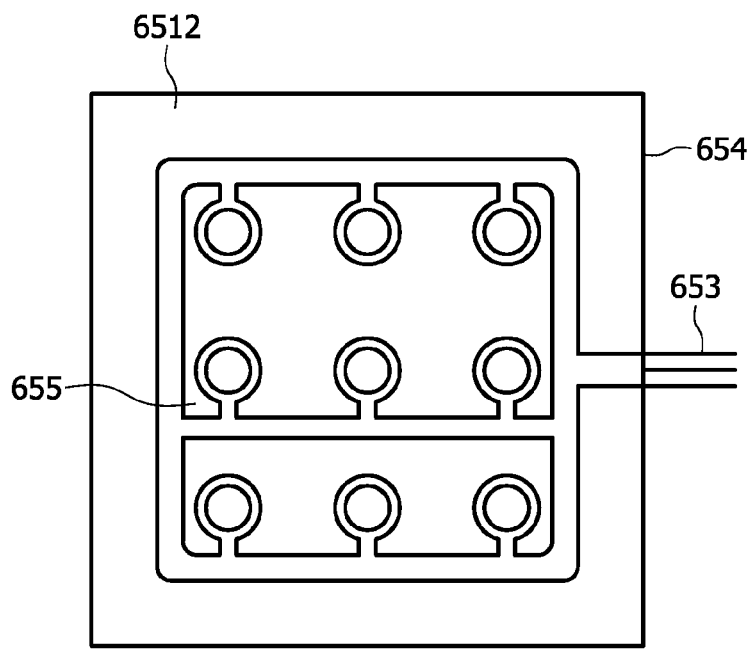
FIG. 14B is a planar view of the inner side of the front plate of the semiconductor device of FIG. 13A showing the layout of the channel assembly.

FIG. 14B is a planar view of the underside 6512 of front plate 651 giving a planar view of channel assembly 655. The channel assembly 655 is configured to provide an airflow path from air inlet 653 to the peripheral region around each heat sink 612 so that air is directed onto each heat sink 612 at an upper region of the heat sink close to the respective LED element 611.

Back plate 652 of housing 650 is provided with a plurality of apertures 6522 through each of which a corresponding heat sink 612 extends from the respective LED element 611 such that each heat sink is in contact with air outside the housing, thereby enabling heat to be transferred from each heat sink 612 to the air outside the housing.

Airflow is generated by an airflow generator in fluid communication with air inlet 653. The airflow generator may be an airflow generator similar to the airflow generator of the first embodiment providing a steady airflow to each heat sink 612. Alternatively, air flow may be provided in the form of air pulses by a pulsed air generator similar to the synthetic jet actuator of the second and third embodiments. The length and cross section of the channels forming channel assembly 655 may be selected in such a way that the driving power of a synthetic jet actuator used to generate air flow is minimised. An airstream directed by channel assembly 655 transversally through the housing 650 between front plate 651 and back plate 652 onto each heat sink 612 of the corresponding LED element 611. The forced flow of air is guided to the upper region of each heat sink 612 to flow along the length of the heat sink 612 between fins 6121, in an axial direction from the top plate 651 towards the bottom plate 652, and exits the housing 650 via the respective aperture 6522. Each aperture 6522 forms an air flow outlet.

Heat is transferred from each heat sink 612 to the air flow thereby cooling each LED element 611. Since in this embodiment the cooling air flow is forced along the length of each heat sink 612 to the corresponding aperture 6522, an improvement is cooling efficiency can be achieved. Furthermore since no internal fans are required for each LED element to provide the cooling airflow, the overall device can be less cumbersome and less noisy. Moreover, the reduced size of each heat sink allows the LEDs to be placed closer to one another and higher density packing of LEDs to be achieved.

In this embodiment efficient cooling of the LED elements would be particularly desirable in view of the quantity of thermal energy generated by the number of LEDs, and their proximity to one another. Since cooling air is forced onto each heat sink and forced along the heat sink in order to exit the housing, effective cooling can be achieved. Since the heat sinks 612 share a common air flow inlet 653 the overall size of the device is reduced. Further, since the air flow inlet 653 is disposed on a lateral wall 654 of the housing an overall flatter device can be obtained.

While in the sixth embodiment the LED-dissipator assembly is similar to that of the first embodiment, it will be appreciated that the device may have a plurality of LED-dissipator assemblies similar to that of the fourth or fifth embodiment in which the LED-dissipator assembly is provided with a snap fitting.

A further embodiment of the invention is illustrated in FIG. 14. This embodiment is similar to the sixth embodiment of the invention and differs in that the inner space of housing 750 between the front plate 751 and the back plate 752 forms a channel providing the fluid path from the airflow inlet 753 to each heat sink 712. In this embodiment a plenum providing uniform pressure throughout the internal space between the front plate 751 and the back plate 752 is formed by the housing. Air flowing into the housing via inlet 753 is directed by means of the plenum to apertures 7522 and flows along the length of the corresponding heat sinks 712 transferring heat from heat sinks 712 to the air flow.

Figure 15:
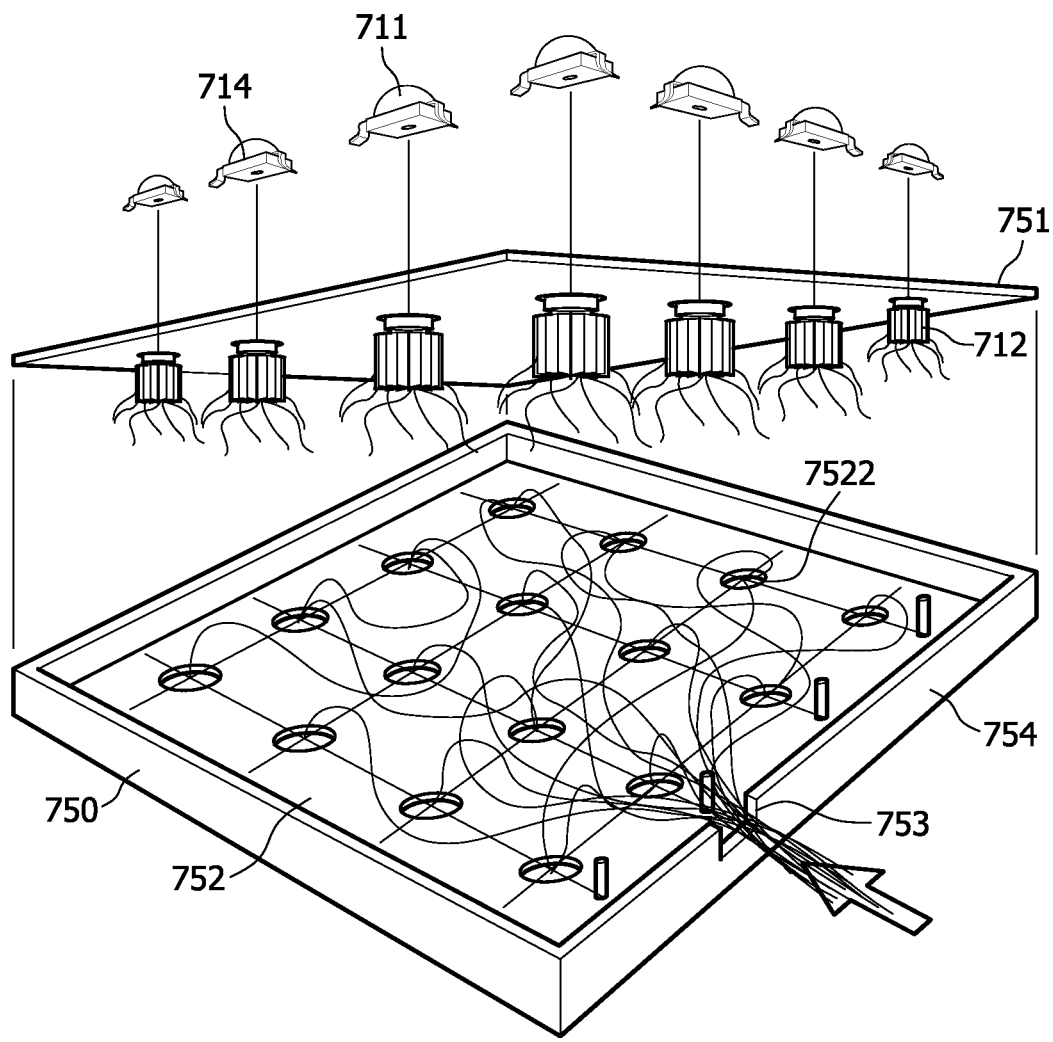
FIG. 15 is an exploded view of a semiconductor cooling device according to a further embodiment of the invention.
Figure 16:
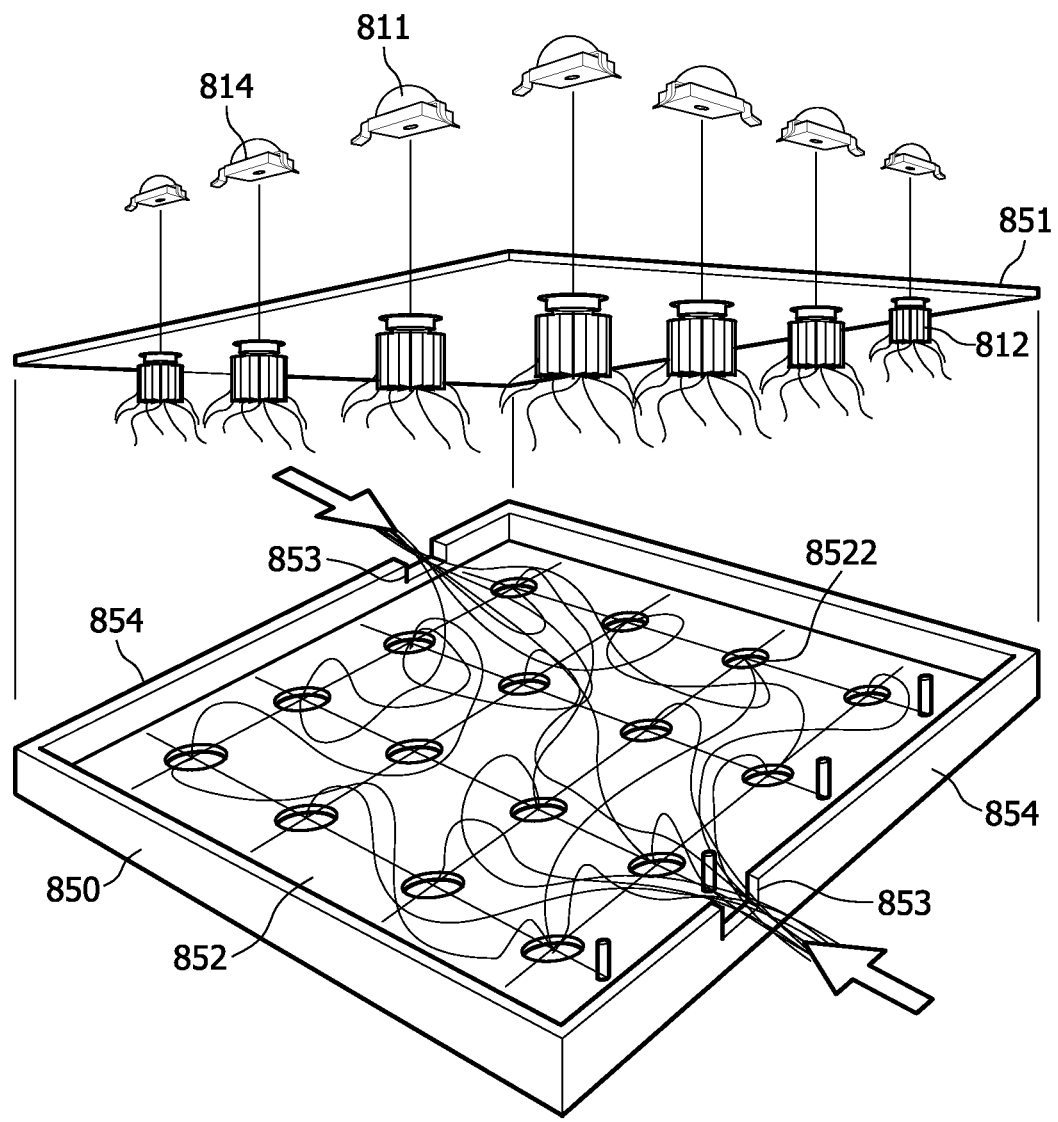
FIG. 16 is an exploded view of a semiconductor cooling device according to an alternative embodiment of the invention.

Although in the preceding embodiments the housing is provided with a single air flow inlet it will be appreciated that the housing may be provided with any number or arrangement of air flow inlets. For example, an alternative embodiment is illustrated in FIG. 16. This embodiment is similar to the embodiment of FIG. 15 but has two air flow inlets 853 on opposing walls of the housing 850.

While in the foregoing embodiments of the invention, each LED element is provided with a respective heat dissipator, it will be appreciated that in alternative embodiments of the invention a heat dissipator may be shared by two or more LED elements. Furthermore, it will be appreciated that two or more heat dissipators may extend through the same aperture.

This embodiment finds application in both high flux applications where the number of semiconductor dies and their proximity to one another requires effective cooling and also in low flux applications with long life time requirements where thermal management is of importance for stable operation.

Although the present invention has been described hereinabove with reference to specific embodiments, the present invention is not limited to the specific embodiments, and modifications will be apparent to a skilled person in the art which lie within the scope of the present invention.

For instance, although in the foregoing embodiments of the invention the device has been described in relation to the cooling of LEDs it will be appreciated that such a cooling device may be used to cool other types of solid state light sources or semiconductor dies or chips. For example the assembly may be used to transfer heat away from integrated circuits (IC).

In an alternative embodiment of the invention the heat sink may be made out of a heat conductive plastic or ceramic. In such an embodiment the heat sink may be made by injection moulding. In a further embodiment of the invention the heat slug may be provided by a separate component rather than forming part of the PCB. It will also be appreciated that in some embodiments of the invention a heat slug may not be present.

It will be appreciated that the heat sink is not restricted to the form illustrated in the drawings and may take any form suitable for dissipating heat from its surface. For example the heat sink may not be hollow and/or may have a different configuration of fins.

In alternative embodiments of the invention the heat sink may be fitted with a heat pipe for transferring heat away from the semiconductor die to increase the efficiency of heat transfer.

Although in the fourth and fifth embodiments the LED-dissipator assembly is provided with a support member, it will be understood that in alternative embodiments of the invention, the heat sink and heat slug may form the supporting means for the LED-dissipator assembly. In further embodiments the supporting means may co-operate with the back plate, or with both the back plate and the front plate.

While the foregoing embodiments have been described with respect to an airflow it will be appreciated that the cooling fluid flow may be a liquid flow or any other suitable gas.

It should also be appreciated that in alternative embodiments of the invention the fluid flow may be directed along the heat sink in an opposing axial direction to the direction of air flow of the foregoing embodiments. It will also be appreciated that the air flow generator may be connected at any point of a fluid path such that it is in fluid communication with the heat sink.

Although the foregoing embodiments have been provided with an aperture for directing the air flow in an axial direction from one end of the heat dissipator to the other end, it will be appreciated that in any suitable formation providing an air flow channel along the length of the heat dissipator may be used.

While in some of the foregoing embodiments the channel assembly is provided on the front plate, it will be understood that in further embodiments the channel assembly may be provided on the back plate.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A cooling device for cooling a semiconductor die, the device comprising:
   a heat dissipator thermally couplable to a semiconductor die, the heat dissipator being arranged to dissipate heat from the semiconductor die;
   a housing to which the heat dissipator is mounted and within which the heat dissipator is disposed;
   a first fluid flow passage of the housing for dispensing a forced fluid flow into or out of the housing; and
   a fluid flow path arranged to direct the forced fluid flow in a first direction between the first fluid flow passage and the heat dissipator, and further arranged to force fluid of the forced fluid flow along the heat dissipator in a second direction out of or into the housing that is different from the first direction.

2. A cooling device according to claim 1, wherein the housing comprises:
   a first plate for supporting the semiconductor die; and
   a second plate opposing the first plate, the second plate being provided with an aperture arranged to receive the heat dissipator therethough, wherein at least part of the fluid flow path for forcing the fluid flow along the heat dissipator in the second direction is defined by was of the aperture and walls of the heat dissipator.

3. A cooling device according to claim 2, wherein the first fluid flow passage is disposed on a lateral wall of the housing perpendicular to the first plate and the second plate.

4. A cooling device according to claim 2, wherein the aperture for receiving the heat dissipator forms a second fluid flow passage for exiting or receiving fluid flow from or to the housing.

5. A cooling device according to claim 2, wherein the heat dissipator extends from the semiconductor die though the aperture such that the heat dissipator is in contact with a fluid medium outside the housing.

6. A cooling device according to claim 1, wherein at least part of the fluid flow path is defined by a channel assembly.

7. A cooling device according to claim 1, wherein the first fluid flow passage is in fluid communication with a pulsed airjet generator.

8. A cooling device according to claim 6 wherein a hollow core of the heat dissipator is in fluid communication with the pulsed airjet generator.

9. A cooling device according to claim 1, wherein the heat dissipator is couplable to the housing by a snap-fitting.

10. A cooling device according to claim 1, wherein the semiconductor die is one of a plurality of semiconductor dies and wherein the heat dissipator is one of a plurality of heat dissipaters included in the device that are thermally couplable to the plurality of semiconductor dies, and wherein the cooling device further comprises at least one aperture defined on the housing for receiving the heat dissipators, wherein the fluid flow path is arranged to direct fluid between the first fluid flow passage and each of the heat dissipators.

11. A cooling device according to claim 9, wherein the heat dissipator is one of a plurality of heat dissipators and wherein the device further comprises:
the plurality of heat dissipators, each heat dissipator being thermally couplable to a corresponding semiconductor die; and
a plurality of apertures, each aperture being arranged to receive a corresponding heat dissipator therethrough.

12. An electronic device comprising the semiconductor die and the cooling device according to claim 1 for cooling said semiconductor die.

13. An optical device comprising the semiconductor die of claim 1, said die having light emissive properties, and comprising the cooling device according to claim 1 for cooling said semiconductor die.

14. A method of cooling a semiconductor die, the method comprising:
thermally coupling a heat dissipator to the semiconductor die to dissipate heat from the semiconductor die;
mounting the heat dissipator to a housing so that the heat dissipator is disposed within the housing;
dispensing a forced fluid flow through a first aperture defined on the housing;
directing the forced fluid flow into or out of the housing along a fluid path in a first direction between the first aperture defined on the housing and the heat dissipator; and
directing the forced fluid flow along the heat dissipator in a second direction out of or into the housing that is different than the first direction.

15. A method according to claim 14, wherein the fluid flow is forced along the heat dissipator in the second direction to exit the housing via a second aperture in which the heat dissipator is received.

16. A method according to claim 14, wherein the forced fluid flow is provided in the form of pulsed jets of fluid.

17. A method according to claim 14, further comprising ingesting fluid from around the heat dissipator and/or expelling fluid along the heat dissipator.

18. A method according to claim 14, further comprising ingesting fluid from a hollow core of the heat dissipator and/or expelling fluid to the hollow core of the heat dissipator.

19. A cooling device for cooling a semiconductor die, the device comprising:
plurality of heat dissipators, each heat dissipator being thermally couplable to a corresponding semiconductor die, the heat dissipators being arranged to dissipate heat from the corresponding semiconductor dies;
a plurality of apertures, each aperture being arranged to receive a corresponding heat dissipator therethrough;
a housing to which the heat dissipators are mounted;
a first fluid flow passage for providing a forced fluid flow within the housing; and
a fluid flow path arranged to direct fluid in a first direction between the first fluid flow passage and the heat dissipators, and further arranged to force fluid along the heat dissipators in a second direction different to the first direction.

* * * * *